United States Patent
Roeck

(10) Patent No.: US 6,650,124 B2
(45) Date of Patent: Nov. 18, 2003

(54) METHOD FOR CHECKING AN OCCURRENCE OF A SIGNAL COMPONENT AND DEVICE TO PERFORM THE METHOD

(75) Inventor: Hans-Ueli Roeck, Hombrechtikon (CH)

(73) Assignee: Phonak AG, Stafa (CH)

(*) Notice: Subject to any disclaimer, the term of this patent is extended or adjusted under 35 U.S.C. 154(b) by 0 days.

(21) Appl. No.: 09/972,468

(22) Filed: Oct. 5, 2001

(65) Prior Publication Data

US 2003/0071635 A1 Apr. 17, 2003

(51) Int. Cl.[7] ............................ G01R 29/26; G01R 23/00
(52) U.S. Cl. ........................ 324/614; 702/75; 702/179; 702/191
(58) Field of Search ............................ 324/604–606, 324/76.39, 76.74, 76.79, 614; 381/14, 18; 702/75, 70, 74, 124, 126, 179, 191, 192

(56) References Cited

U.S. PATENT DOCUMENTS

| | | | | |
|---|---|---|---|---|
| 5,056,052 A | * | 10/1991 | Wick et al. | 702/194 |
| 5,119,321 A | * | 6/1992 | Burton et al. | 702/194 |
| 5,333,191 A | | 7/1994 | McCarthy | 379/386 |
| 5,353,346 A | | 10/1994 | Cox | 379/386 |
| 2002/0064291 A1 | * | 5/2002 | Kates et al. | 381/318 |

FOREIGN PATENT DOCUMENTS

| | | | | |
|---|---|---|---|---|
| EP | 0 550 144 A | | 7/1993 | H04Q/1/457 |
| EP | 0 656 737 A | | 6/1995 | H04R/25/00 |
| WO | 99 51059 A | | 10/1999 | H04R/25/00 |

* cited by examiner

*Primary Examiner*—N. Le
*Assistant Examiner*—Donald M Lair
(74) *Attorney, Agent, or Firm*—Pearne & Gordon LLP

(57) ABSTRACT

In order to check an occurrence of a signal component in an input signal, a method and a device is provided. The method comprises the steps of generating a measure for the frequency of the input signal from the input signal, determining a variance of the measure for the frequency of the input signal, comparing the determined variance with a predetermined limit value, and confirming the occurrence of the signal components if the variance lies within a predetermined range in relation to the predetermined limit value. The occurrence of a signal component in an input signal can be determined very fast and by performing only a few steps. Therefore, the method according to the invention and the device according to the invention can very well be used in particular in mobile devices, as for example in hearing devices.

32 Claims, 3 Drawing Sheets

METHOD FOR CHECKING AN OCCURRENCE OF A SIGNAL COMPONENT AND DEVICE TO PERFORM THE METHOD

BACKGROUND OF THE INVENTION

The detection of a narrow band signal component, such as a sinusoidal signal in a noise signal, is a problem that often needs to be solved. Different known methods are available to solve this problem. A first method is using correlation calculations, a second is a method based on parametrizing followed by peak picking, and a third is using a number of zero crossing counters.

All these known methods bear the drawback that high computer power is necessary because of the complex algorithms which must be applied. In particular, this is the case if speech signals are being processed. Possible fields of application are telecommunication products, audio products or hearing devices. Under the term "hearing device" so-called hearing aids, which are used to correct an impaired hearing of a person, as well as all other acoustical communication systems, for example radio sets, must be understood.

BRIEF SUMMARY OF THE INVENTION

The present invention refers to a method for checking an occurrence of a signal component in an input signal, a use of the method, as well as a hearing device.

To check the occurrence of a signal component in an input signal a method is disclosed, where a measure for the frequency of an input signal is determined, the determined variance is compared with a given limit value, and, the occurrence of a signal component is confirmed if the variance is within a given range in relation to the given limit value.

The method according to the present invention is characterized by a number of very simple method steps, which can be performed by using little computer power. Therefore, the method according to the present invention qualifies in particular for the use in systems having restricted access to energy supply, as for example for mobile devices which must be power line independent, or for systems in which the occurrence of a signal component must be determined very quickly.

In further embodiments of the present invention it is proposed to use the method for the detection and elimination of signal feedback. Signal feedback is a known problem in hearing devices, in mobile telephones and other telecommunication products. A number of solutions have been elaborated by the telecommunication industry. It is known to attenuate the signals in the signal feedback path by corresponding adjustment of the attenuation in the transfer function in the feedback path. Furthermore, the use of auto- and/or cross correlations schemes has been envisioned by which the correlation of the input signal and the output signal are calculated in the time domain or in the frequency domain. The results of the calculations are used to adjust the transfer function in the signal feedback path, using the LMS—(Least Mean Square)—algorithm (feedback canceller). Alternatively, the results of the calculations are used to adjust the transfer function in the forward path, whereby the loop gain is reduced at the critical frequencies.

For further information on the known methods it is referred to the following printings: U.S. Pat. No. 5,680,467, EP-0 656 737, WO 99/26453, WO 99/51059, DE-197 48 079.

The known methods have been used successfully but have the drawback that again a high computer power is necessary to obtain useful results. The use of the known algorithms in hearing devices leads to an increased energy usage. As a result thereof, the operating time until the next recharge or replacement of the batteries is reduced which must be prevented.

In case the loop gain reaches a value which is greater than one in a given frequency range, and in case the magnitude of signal components is some decibels lower at other frequencies than the frequency of the feedback signal if the gain is increased in the forward path, then a notch filter according to the present invention can be used to reduce the signal feedback. In case that different critical frequencies lie too far apart, several notch filters can be used according to a further embodiment of the present invention.

In order that a notch filter can be adjusted to the critical frequency, i.e. the feedback frequency, the critical frequency must be detected first. According to the invention this is performed by the calculation of the variance of the measure for the frequency of the input signal, whereas signal feedback is being detected if the variance lies within a predetermined range in relation to a predetermined limit value.

BRIEF DESCRIPTION OF THE DRAWINGS

These and further features of the present invention will become apparent by the following description and drawings, which show exemplified embodiments of the present invention, wherein.

DETAILED DESCRIPTION OR THE PREFERRED EMBODIMENTS

Figure 1:
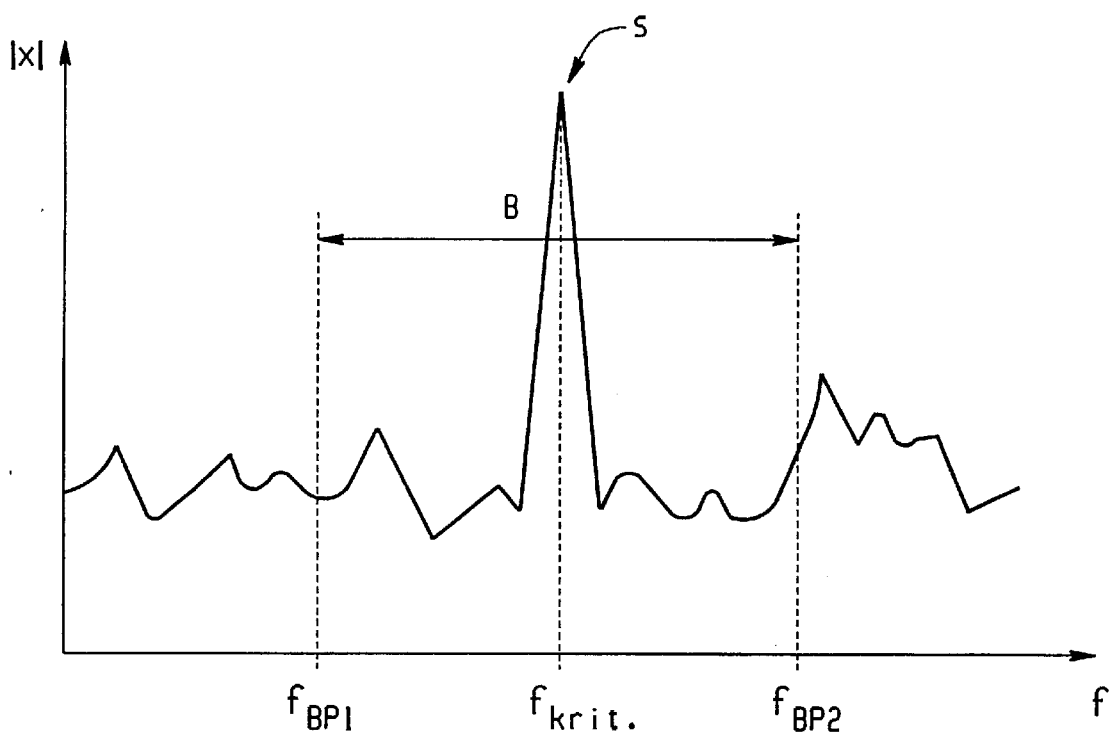
FIG. 1 shows a magnitude spectrum of an input signal having a superimposed narrow bandwidth signal component.
Figure 2:
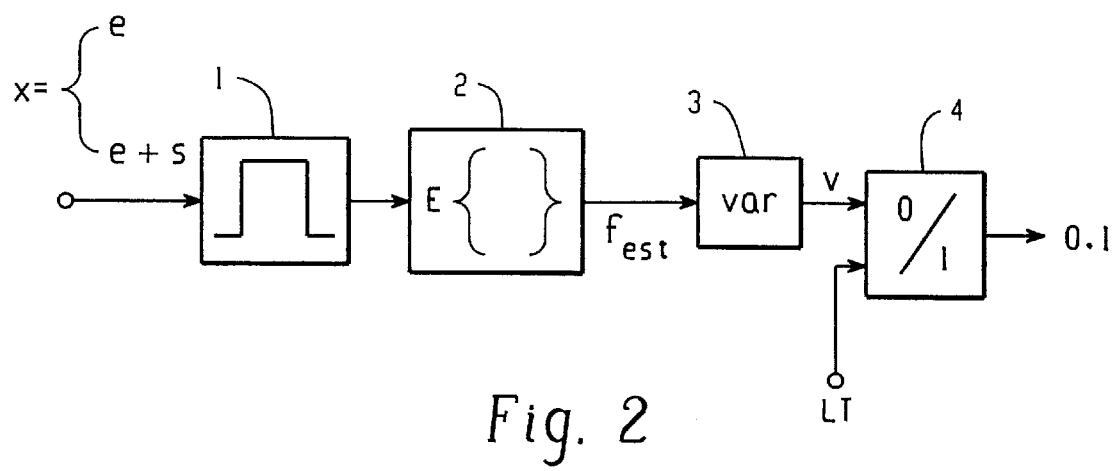
FIG. 2 shows a block diagram of a circuit arrangement for checking of an occurrence of a signal component in the input signal.
Figure 3:
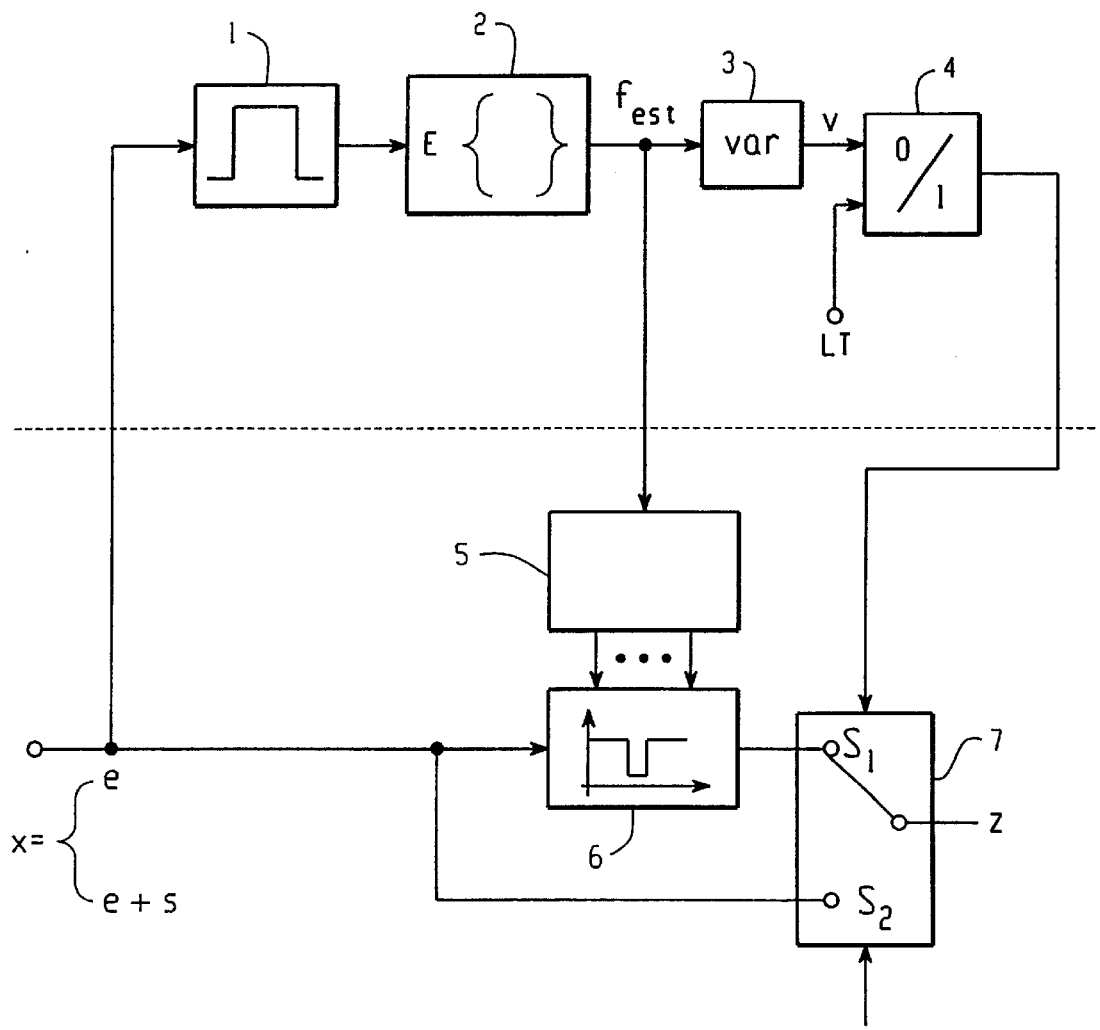
FIG. 3 shows a block diagram of a circuit arrangement for the detection and elimination of a signal feedback component.
Figure 4:
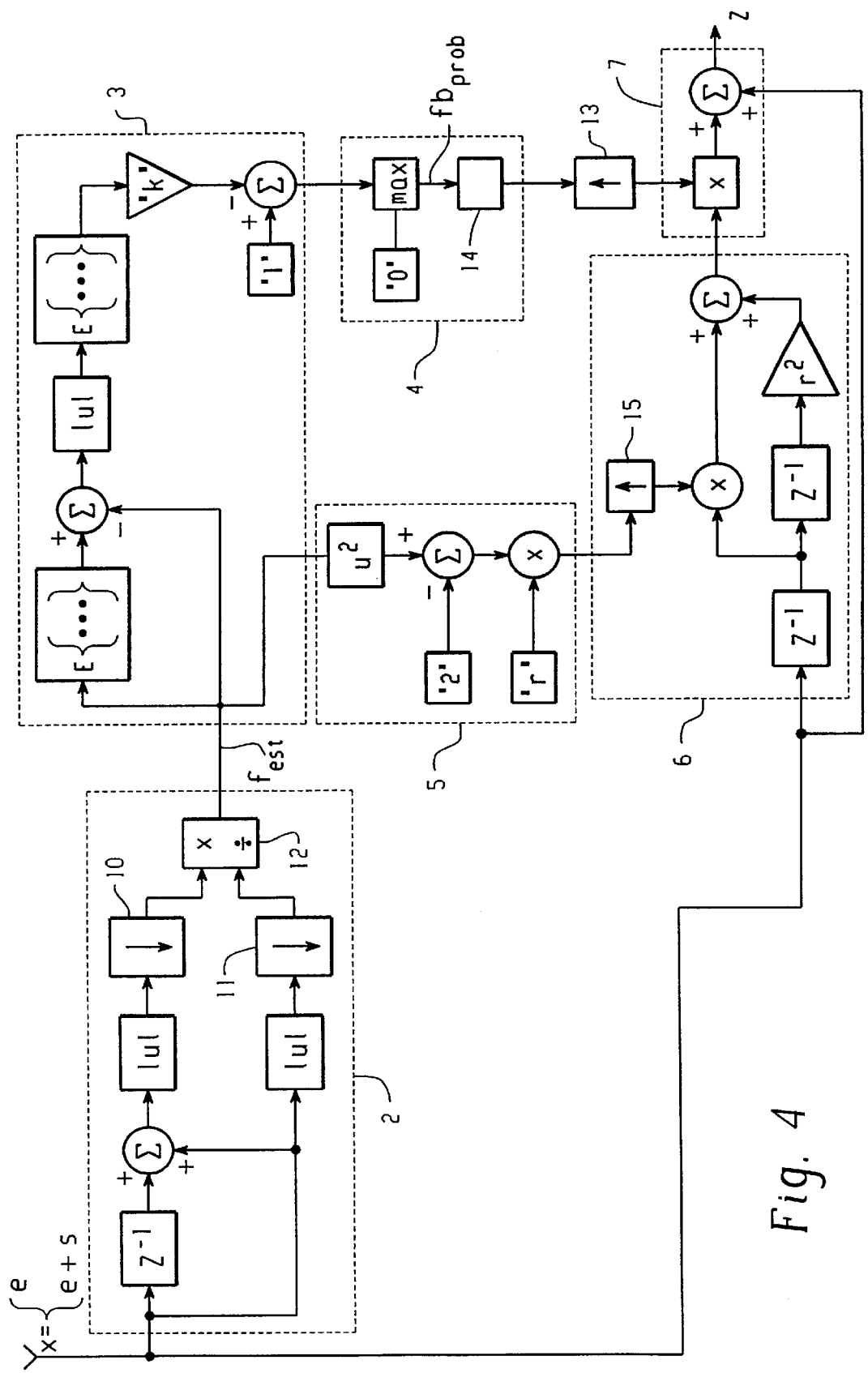
FIG. 4 shows a further specific embodiment of the circuit arrangement according to FIG. 3.

FIG. 1 shows a magnitude spectrum, i.e. the magnitude of an input signal x in function of the frequency f. In a frequency range B, which is limited by the upper and lower frequency $f_{BP1}$ and $f_{BP2}$, respectively, a narrow bandwidth signal component s with a middle frequency $f_{krit}$ is identifiable. The magnitude at the frequency $f_{krit}$ lies some dB (Decibel) higher than the rest of the input signals x in the frequency range B. In a first embodiment of the present invention it is provided to detect the occurrence of the signal component s. A circuit arrangement, which can be used therefore, is schematically shown in FIG. 2. In a second embodiment of the present invention, it is provided to eliminate a detected signal component s from the input signal x, which signal component s emerged e.g. from a signal feedback. If the elimination of the signal component s cannot be reached, it is at least possible to attenuate the signal component s in a desired measure. Possible circuit arrangements, which can be used to perform this task, are schematically shown in FIGS. 3 and 4.

According to FIG. 2, a number of functional units are connected in series, starting with a band pass filter 1, an estimator unit 2, a variance unit 3 and a comparator unit 4.

The input signal x, which consists either of an exploitable signal e or of an exploitable signal e and a superimposed signal component s, is fed to the band pass filter 1 having upper and lower limit frequencies $f_{BP1}$ and $f_{BP2}$ according to FIG. 1, whereas it is assumed that the signal component s, if it exists, lies within the frequency range B (FIG. 1). The band-limited signal, i.e. the output signal of the band pass filter 1, is fed to the estimator unit 2, in which a measure $f_{est}$ for the frequency of the input signal s is determined.

The term "measure $f_{est}$ for the frequency of the input signal x" basically means any frequency-dependent function.

It is proposed that as a first function $y_1$ of the expected value of the magnitude of a low-pass filter is used. In time-discrete format, such a function can be stated as follows:

$$y_1(n) = E\{|x(n)+x(n-1)|\}$$

and in the z-plain, respectively, $$Y_1(z) = E\{|1+z^{-1}| \cdot |X(z)|\},$$

whereas a normalization is preferably performed using the level of the input signal x in order that the level itself does not have an influence on the measure $f_{est}$ for the frequency. For the last mentioned reason, two functions are necessary, of which at least one is frequency-dependent.

As second function $y_2$, a corresponding high-pass filter, or much easier, merely the expected value of the magnitude of the input signals x, is chosen:

$$y_2 = E\{|x(n)|\}$$

By dividing the function $y_1$ by the function $y_2$ the desired measure $f_{est}$ for the frequency of the input signal x, which is now magnitude-independent, is obtained, namely:

$$f_{est}(n) = \frac{E\{|x(n)+x(n-1)|\}}{E\{|x(n)|\}} = \sqrt{2 \cdot (1+\cos\omega)}$$

whereby ω refers to the angular frequency.

The determination of the expected value can also be approximated by an moving averager of first orders which can be described by the following equation:

$$y(n) = |x(n)| + \beta \cdot (y(n-1) - |x(n)|),$$

whereas $$\beta = e^{-\frac{T}{\tau}}$$

and whereas T corresponds to the sample interval and τ corresponds to a time constant having a value of approx. 20 ms.

Whether a signal component s in the input signal x exists, can be determined by calculating the variances v of the measure $f_{est}$ for the frequency. Therefore, the variances unit 3 according to FIG. 2 is provided. If the variance v lies below a given limit value LT, it can be concluded that a narrow band-width, frequency-stable signal component s exists in the frequency range B (FIG. 1). As a prerequisite it is mandatory that signal component s, if it exists, bears a certain stability and that the exploitable signal e is stable in this sense. Information regarding the calculation of the variance can be obtained, for example, from the standard work of Athanasios Papoulis entitled "Probability, Random Variables, and Stochastic Processes" (McGraw-Hill, 1984, page 108 ff.).

The mentioned comparison of the calculated variance v and the predetermined limit value LT takes place in the comparator unit 4 having an output signal of either zero or one, depending on whether the variance v is larger than the limit value LT or vice versa.

The method according to the present invention described along with FIG. 2 can be used in particular for the detection of a punch of a pushbutton of a telecommunication terminal supporting frequency dialing. As is generally known, each of the twelve pushbuttons of such a terminal is coded by two of a total of seven sinusoidal signals, whereas the frequencies of the signals are known. The detection of punching one of the pushbuttons is therefore limited to check the occurrence of signals having corresponding frequencies. According to the two detected frequencies the pushbuttons being punched can be identified, whereas the circuit arrangement according to FIG. 2 can be used for each possible signal. Thereby, the band-pass filter is adjusted in such a way that only one signal can pass through the band-pass filter. Naturally, there exists the possibility that a filter bank consisting of seven band-pass filters to select each of the single possible signals is provided and that the further processing of the signals in the estimator unit 2, in the variance unit 3 and in the comparator unit 4 is dealt with in a time multiplex process.

FIG. 3 shows a further block diagram of a further embodiment which is based on the one shown in FIG. 2. The block diagram shown above the dashed line in FIG. 3 is exactly the same as the one shown in FIG. 2. Below the dashed line according to FIG. 3 a filter unit 6, a coefficient calculation unit 5 and a switching unit 7 are provided.

The input signal x fed to the band-pass filter 1 is further connected to the filter unit 6 and to one of the two switching contacts S2 of the switching unit 7. The output signal of the filter unit 6 is connected to the further switching contact S1. Furthermore, the measure $f_{est}$ for the frequency of the input signals x is fed to the coefficient calculation unit 5, in which the coefficients of the filter implemented in the filter unit 6 are calculated in a way yet to describe. The calculated coefficients will be transferred to the filter unit 6 as soon as the coefficients are determined. The determination of the measure $f_{est}$ for the frequency can be provided in a way described along with FIG. 2.

Finally, either the input signal x directly or the output signal of the filter unit 6 will be switched to the output z in the switching unit 7 according to a control signal generated in a comparator unit 4. In other words, the input signal x is either filtered in the filter unit 6 or the input signal x will be passed to the output z without being processed. The switching is advantageously done in a "soft way", which means the transition from one stage to another is done is a smooth way.

As a consequence, the method according to the invention and the device according to the invention, respectively, can be advantageously used to detect and eliminate a feedback signal, to be precise, for telecommunication products as well as for hearing devices, whereas the computer power necessary for the calculations is diminishing. As a result, in particular when using the method according to the invention in a hearing devices the energy consumption can be held at a low level for the additional computational efforts.

In case that the signal component s must be suppressed by the filter unit 6, or at least attenuated, the filter unit 6 is realized as notch filter, whereas the maximum attenuation of the notch filter must lie in the middle of the frequency $f_{krit}$ to be suppressed (FIG. 1) A notch filter can be realized according to the following equation:

$$H(z)=1+b_1 \cdot z^{-1}+b_2 \cdot z^{-2}$$

whereas $$b_1=-2 \cdot r \cdot \cos \omega$$

and $$b_2=r^2.$$

The notch filter according to the above mentioned equation features one single zero having a distance of radius r to the origin. It is proposed to fix the radius r, for example by giving it the value 0.98, whereas only cos ω has to be determined in order to determine the coefficient $b_1$. This value can be derived according to the present invention from the measure $f_{est}$ for the frequency of the input signal x by solving the above mentioned equation for the measure $f_{est}$ for cos ω. One can obtain the following equation:

$$b_1 = -2 \cdot r \cdot \left(\frac{f_{est}^2}{2} - 1\right)$$

In a further embodiment of the present invention, it is provided to determine the notch filter according to the following equation:

$$H(z) = \frac{1 + b_1 \cdot z^{-1} + b_2 \cdot z^{-2}}{1 + a_1 \cdot z^{-1} + a_2 \cdot z^{-2}},$$

whereas $$a_1=-2 \cdot r_P \cdot \cos \omega,$$

$$b_1=-2 \cdot r_Z \cdot \cos \omega,$$

and $$a_2=r_P^2,$$

$$b_2=r_Z^2,$$

The equations mentioned above can again be solved for cos ω in an analogous way. Hereby, the following two equations can be obtained:

$$a_1 = -2 \cdot r_P \cdot \left(\frac{f_{est}^2}{2} - 1\right)$$

and $$b_1 = -2 \cdot r_Z \cdot \left(\frac{f_{est}^2}{2} - 1\right).$$

The equations mentioned above describe thereby an algorithm for the estimation of a narrow bandwidth signal component s and, at the same time, allow to obtain coefficients for the notch filter to suppress the signal component s.

FIG. 4 shows a specific embodiment of the schematic representation of the present invention according to the block diagram of FIG. 3. The processing units designated in FIG. 3 are identified by dashed lines in FIG. 4, whereby the same reference signs are used as in FIG. 3.

In the estimator unit 2, the block diagram according to the equations, which have been described in connection with FIG. 2, is shown. Besides the units resulting directly from the above mentioned equations and which units are not further explained, two decimation units 10 and 11 are provided in addition, which are provided before a quotient unit 12 and which reduce the data rate in order to reduce the already reduced computational effort even further. Methods for the data rate reduction are generally known and are further explained, for example, in the standard work of R. E. Crochiere et al. entitled "Multirate Digital Signal Processing" (Prentice-Hall Signal Processing Series, Prentice-Hall, Inc., Englewood Cliffs, N.J., 1983). Antialiasing filters are not shown in the figures; they are a part of the decimation units 10 and 11.

Without the decimation units 10 and 11 the measure $f_{est}$ for the frequency of the input signal x can be obtained at the output of the estimator unit 2, as has been explained along with FIG. 2;

$$f_{est}(n) = \frac{E\{|x(n)+x(n-1)|\}}{E\{|x(n)|\}}$$

Considering the above mentioned explanations, in particular the one made in connection with the block diagram shown in FIGS. 2 and 3, a probability measure $fb_{prob}$ for the feedback can be determined from the input signal x according to the following equation in the variances unit 3 or in the comparator unit 4, respectively:

$$fb_{prob} = \max[1 - k \cdot E\{|\overline{E}\{f_{est}\} - f_{est}|\}, 0],$$

whereas k represents a sensitivity parameter through which the amount of influence of the control mechanism is determined. According to FIG. 4 the probability measure $fb_{prob}$ is not yet the output signal of the comparator unit 4 since it is necessary to change the data rate in interpolator unit 13, in which a data rate reduction is performed analogously to the data rate increase in the decimation units 10 and 11, i.e. in the interpolation unit 13 the data stream is readjusted to the original data rate of the input signal x.

In the above mentioned equation for the probability measure $fb_{prob}$ the expected value E{. . . } is again realized, in the simplest embodiment of the method according to the present invention, as a moving averager with a short time constant for a signal follow-up towards larger signal values, but with a long time constant for the signal follow-up towards smaller signal values. Such a moving averager is also called a fast attack—slow release averager. A corresponding moving averager 14 is connected to the output of the comparator unit 4. Thereby, the control behavior of the closed loop control circuit is further improved.

The expected value designated $\overline{E}\{\ldots\}$ is a symmetric moving averager which means that the attack and release time constants are equal.

In the filter unit 6 a notch filter according to the following equation is realized:

$$H(z)=1+fb_{prob} \cdot (b_1 \cdot z^{-1}+b_2 \cdot fb_{prob} \cdot z^{-2})$$

whereas the coefficients $b_1$ and $b_2$ are determined as follows in the coefficient calculation unit 5:

$$b_1 = -2 \cdot r \cdot \left(\frac{f_{est}^2}{2} - 1\right) \text{ and}$$

$$b_2=r^2.$$

The radius r is again the distance from the zero to the origin in the z-plane and is preferably fix. It could have been shown that it is advantageous to choose a value of 0.98 For the radius r. Instead of the above mentioned specific transfer function for the notch filter the general form is shown in the following, which is preferably used:

$$H(z) = \frac{1 + fb_{prob} \cdot (b_1 \cdot z^{-1} + b_2 \cdot fb_{prob} \cdot z^{-2})}{1 + fb_{prob} \cdot (a_1 \cdot z^{-1} + a_2 \cdot fb_{prob} \cdot z^{-2})},$$

whereas $$b_1 = -2 \cdot r_Z \cdot \left(\frac{f_{est}^2}{2} - 1\right),$$

$$a_1 = -2 \cdot r_P \cdot \left(\frac{f_{est}^2}{2} - 1\right)$$

$$b_2 = r_Z^2,$$

$$a_2 = r_P^2 \text{ and}$$

$$fb_{prob} = \max[1 - k \cdot E\{|\overline{E}\{f_{est}\} - f_{est}|\}, 0]$$

With r, a constant is referenced having a value of preferably 0.98; k is a sensitivity parameter for the adjustment of control characteristics, whereas the value for k is preferably equal to 10.

Having thus shown and described what is at present considered to be the preferred embodiments of the invention, it should be noted that the same has been made by way of illustration and not limitation. Accordingly, all modifications, alterations and changes coming within the spirit and scope of the invention are herein meant to be included.

What is claimed is:

1. A method for checking an occurrence of a signal component in an input signal, whereas the method comprises the steps of
   generating a measure for the frequency of the input signal from the input signal,
   determining a variance of the measure for the frequency of the input signal,
   comparing the determined variance with a predetermined limit value, and
   confirming the occurrence of the signal components if the variance lies within a predetermined range in relation to the predetermined limit value.

2. The method according to claim 1, wherein the occurrence of the signal components is confirmed if the variance is smaller than the predetermined limit value.

3. The method according to claim 2, wherein the signal component is suppressed in the input signal.

4. The method according to claim 3, wherein the measure for the frequency is determined by dividing of at least two functions, of which at least one is frequency-dependent.

5. The method according to claim 4, wherein the measure for the frequency is determined from dividing of two functions, one of which having a low-pass filter transfer function and the other function corresponds to the expected value of the input signal.

6. The method according to claim 3, wherein the input signal is band-limited before the measure for the frequency is generated.

7. The method according to claim 6, wherein the measure for the frequency is determined by dividing of at least two functions, of which at least one is frequency-dependent.

8. The method according to claim 7, wherein the measure for the frequency is determined from dividing of two functions, one of which having a low-pass filter transfer function and the other function corresponds to the expected value of the input signal.

9. The method according to claim 2, wherein the measure for the frequency is determined by dividing of at least two functions, of which at least one is frequency-dependent.

10. The method according to claim 9, wherein the measure for the frequency is determined from dividing of two functions, one of which having a low-pass filter transfer function and the other function corresponds to the expected value of the input signal.

11. The method according to claim 1, wherein the signal component is suppressed in the input signal.

12. The method according to claim 11, wherein the input signal is band-limited before the measure for the frequency is generated.

13. The method according to claim 12, wherein the measure for the frequency is determined by dividing of at least two functions, of which at least one is frequency-dependent.

14. The method according to claim 13, wherein the measure for the frequency is determined from dividing of two functions, one of which having a low-pass filter transfer function and the other function corresponds to the expected value of the input signal.

15. The method according to claim 11, wherein the measure for the frequency is determined by dividing of at least two functions, of which at least one is frequency-dependent.

16. The method according to claim 15, wherein the measure for the frequency is determined from dividing of two functions, one of which having a low-pass filter transfer function and the other function corresponds to the expected value of the input signal.

17. The method according to claim 11, wherein a notch filter is used to suppress the signal components in the input signal, whereas as transfer function for the notch filter the following equation is used:

$$H(z) = \frac{1 + b_1 \cdot z^{-1} + b_2 \cdot z^{-2}}{1 + a_1 \cdot z^{-1} + a_2 \cdot z^{-2}},$$

whereas $$a_1 = -2 \cdot r_P \cdot \cos\omega,$$

$$b_1 = -2 \cdot r_Z \cdot \cos\omega,$$

and $$a_2 = r_P^2,$$

$$b_2 = r_Z^2.$$

18. The method according to claim 11, wherein a notch filter is used to suppress the signal components in the input signal, whereas as transfer function for the notch filter the following equation is used:

$$H(z) = \frac{1 + fb_{prob} \cdot (b_1 \cdot z^{-1} + b_2 \cdot fb_{prob} \cdot z^{-2})}{1 + fb_{prob} \cdot (a_1 \cdot z^{-1} + a_2 \cdot fb_{prob} \cdot z^{-2})},$$

whereas $$b_1 = -2 \cdot r_Z \cdot \left(\frac{f_{est}^2}{2} - 1\right),$$

$$a_1 = -2 \cdot r_P \cdot \left(\frac{f_{est}^2}{2} - 1\right)$$

-continued $$b_2 = r_Z^2,$$
$$a_2 = r_P^2 \text{ and}$$
$$fb_{prob} = \max[1 - k \cdot E\{|\overline{E}\{f_{est}\} - f_{est}|\}, 0]$$

wherein r is a constant having the value of 0.98 and k is the sensitivity parameter to adjust the control characteristics.

19. Use of the method according to claim 11 to suppress signal feedback.

20. Use of the method according to claim 19 to suppress a signal component in a hearing device.

21. The method according to claim 1, wherein the input signal is band-limited before the measure for the frequency is generated.

22. The method according to claim 21, wherein the measure for the frequency is determined by dividing of at least two functions, of which at least one is frequency-dependent.

23. The method according to claim 22, wherein the measure for the frequency is determined from dividing of two functions, one of which having a low-pass filter transfer function and the other function corresponds to the expected value of the input signal.

24. The method according to claim 1, wherein the measure for the frequency is determined by dividing of at least two functions, of which at least one is frequency-dependent.

25. The method according to claim 24, wherein the measure for the frequency is determined from dividing of two functions, one of which having a low-pass filter transfer function and the other function corresponds to the expected value of the input signal.

26. Use of the method according to claim 1 or 2 for the detection of a punch of a pushbutton of a telecommunication terminal having frequency dialing.

27. A device, comprising an estimator unit fed by an input signal to determine a measure for the frequency of an input signal and a variances unit being fed by the measure for the frequency of the input signal, the output signal of the variances unit is operationally coupled to the comparator unit, whereas the comparator unit being further fed by a predetermined limit value, a coefficient calculation unit for the calculation of filter coefficients being fed by the measure for the frequency of the input signal, whereas the filter coefficients being transferable to the filter unit, which is on its input side connected with the input signal and which is connected on its output side with a first switch contact of a switching unit, whereas the input signal is fed to a second switch contact of the switching unit and that an output signal of the comparator unit is generating a control signal for the switching unit, whereby either the input signal or the output signal of the filter unit is switchable on the output of the switching unit.

28. The device according to claim 27, wherein the filter unit is a notch filter.

29. The device according to claim 28, wherein the notch filter contains zeros and possibly poles, which positions may be fixed by the measure of the frequency of the input signal.

30. The device according to one of the claims 27 to 29, wherein the measure for the frequency is obtained by dividing at least two functions of which at least one is frequency-dependent.

31. The device according to one of the claims 27 to 29, wherein the measure for the frequency is obtained by dividing two functions, whereas one of the functions has a low-pass filter transfer function and the other of the two functions corresponds to the expected value of the input signal.

32. A hearing device according to one of the claims 27 to 29.

* * * * *